United States Patent
Feng

(10) Patent No.: US 7,764,204 B2
(45) Date of Patent: Jul. 27, 2010

(54) DIGITAL-TO-ANALOG CONVERTING SYSTEM WITH SAMPLING RATE CONVERSIONS AND SAMPLING RATE CONVERTING METHOD THEREOF

(75) Inventor: Lo-Tien Feng, Taipei (TW)

(73) Assignee: ALI Corporation, Taipei (TW)

( * ) Notice: Subject to any disclaimer, the term of this patent is extended or adjusted under 35 U.S.C. 154(b) by 65 days.

(21) Appl. No.: 12/365,176

(22) Filed: Feb. 4, 2009

(65) Prior Publication Data

US 2010/0073212 A1    Mar. 25, 2010

(30) Foreign Application Priority Data

Sep. 19, 2008    (CN) .......................... 2008 1 0165652

(51) Int. Cl.
*H03M 7/00* (2006.01)
(52) U.S. Cl. .......................................... 341/61; 708/313
(58) Field of Classification Search .................. 341/61; 708/313
See application file for complete search history.

(56) References Cited

U.S. PATENT DOCUMENTS 5,717,617 A *  2/1998  Chester ...................... 708/313
6,052,701 A *  4/2000  Koslov et al. ............... 708/313
6,834,292 B2 * 12/2004  Jiang et al. .................. 708/313

OTHER PUBLICATIONS

Hogenauer, An Economical Class of Digital Filters for Decimation and Interpolation, IEEE Transactions on Acoustics, Speech, and Signal Processing, vol. ASSP-29, No. 2, Apr. 1981, pp. 155-162.*
Crochiere et al., Interpolation and Decimation of Digital Signals-A Tutorial Review, Proceedings of the IEEE, vol. 69, No. 3, Mar. 1981, pp. 300-331.*

* cited by examiner

*Primary Examiner*—Howard Williams
(74) *Attorney, Agent, or Firm*—Winston Hsu

(57) ABSTRACT

A digital-to-analog converting system with sampling rate conversions includes an interpolator, S orders of operating and filtering units, an up-converting and down-converting circuit, and a signal processing circuit. The interpolator performs an N-times interpolation on a first digital input signal to generate a second digital input signal. Each order of the operating and filtering unit includes a K-times zero-padding circuit and a filtering circuit. The filtering circuit performs a filtering operation to generate a filtered digital input signal. The up-converting and down-converting circuit performs a B-times up-conversion and an A-times down-conversion on the filtered digital input signal to generate a fourth digital input signal. The signal processing circuit generates an analog output signal according to the fourth digital input signal.

14 Claims, 9 Drawing Sheets

| Sampling Rate | Operating Clock | | | |
|---|---|---|---|---|
| Fs | 256×Fs | 384×Fs | 512×Fs | 768×Fs |
| 48KHz | 12.288MHz | 18.432MHz | 24.576MHz | 36.864MHz |
| 44.1KHz | 11.2896MHz | 16.9344MHz | 22.5792MHz | 33.8688MHz |
| 32KHz | 8.192MHz | 12.288MHz | 16.384MHz | 24.576MHz |

FIG. 1 PRIOR ART

DIGITAL-TO-ANALOG CONVERTING SYSTEM WITH SAMPLING RATE CONVERSIONS AND SAMPLING RATE CONVERTING METHOD THEREOF

BACKGROUND OF THE INVENTION

1. Field of the Invention

The present invention relates to an audio digital-to-analog converting system, and more particularly, to an audio digital-to-analog converting system for lowering operations of sampling rate conversions by using a low-pass filter and method thereof.

2. Description of the Prior Art

In the architecture of an audio DAC system adopted in the industry presently, only processes of interpolation and filtering are applied to the inputted audio signals before the input terminal of a digital-to-analog converter. An audio playback function that supports different sampling rates is lacked.

In order to support the audio playback function with different sampling rates, the audio digital-to-analog converting system must be collocated with an accurate operating clock, wherein the operating clock must be integer-times of its sampling rate. Please refer to FIG. 1. FIG. 1 is a table 100 illustrating corresponding values between audio sampling rates and operating clocks of an audio digital-to-analog converting system. Familiar operating clocks include 256×Fs/384×Fs/512×Fs/768×Fs, wherein Fs represents the abovementioned sampling rate. However, within a general multimedia player, the operating clocks listed in the table 100 do not exist in the original system. To support the audio playback function with different sampling rates, a dedicated phase lock loop (PLL) circuit corresponding to the generated operating clocks must be added into this design, which will increase the manufacturing cost in hardware. Additionally, it is a difficult issue to handle the audio/video synchronization with a multimedia player if we adapt a specific clock rate with different audio sampling rates. With this invention, it provides a solution of the audio/video synchronization in the audio digital-to-analog system under one fixed clock rate following the video processor.

Plenty of methods for providing the function of converting the sampling rate to the audio digital-to-analog converting system under a fixed operating clock have already been disclosed by some scholars. Please refer to FIG. 2 to FIG. 4. FIG. 2, FIG. 3, and FIG. 4 are respectively a diagram showing a conventional digital-to-analog converting system with sampling rate conversions according to the prior art. In FIG. 2, the method of work is firstly converting an input signal In of the digital-to-analog converting system 200 into an audio signal with 48 KHz, wherein the filters $H_1(z)$ and $H_2(z)$ substantially increase the burden of the operations. Take converting 44.1 KHz into 48 KHz as an example, the stop-band gain is set as (−90 dB) under a condition that B=160 and A=147, and thus $H_1(z)$ is a 9665-order FIR filter. Even though the interpolation/decimation mechanism is divided into three segments (8-7, 10-7, 2-3) for processing, its cost for operations is still too high.

In FIG. 3, the method of work is using A, B, and $H_3(z)$ of the digital-to-analog converting system 300 to perform an interpolation on input signals with different sampling rates, wherein the filter $H_3(z)$ also increases the cost for operations. Take converting 44.1 KHz into 48 KHz as an example, the stop-band gain is set as (−90 dB) under a condition that B=2500 and A=147, and thus $H_3(z)$ is a 7917-order FIR filter. Even though the interpolation/decimation mechanism is divided into three segments (25-7, 10-7, 10-3) for processing, its cost for operations is still too high. If the filter $H_3(z)$ is directly removed and only the interpolation/decimation mechanism is performed, a large number of image signals may fall into the audio frequency range (20 Hz~20 KHz) to cause the audio quality poor.

In FIG. 4, the digital-to-analog converting system 350 has been disclosed in the U.S. Pat. No. 6,834,292. Take converting 44.1 KHz into 48 KHz at the input end of the digital-to-analog converting system 350 as an example, parameters are set as below: $R_1=2$, $R_2=32$, $R_3=160$, and $S_1=4704$. Therefore, $H_{11}(z)$ is a 126-order FIR filter, $H_{22}(z)$ is a 143-order FIR filter, and $H_{33}(z)$ is a 3-order comb filter. Without considering the operations of $H_{44}(z)$, totally 193 multiplications are needed to complete one time of sampling frequency conversion. If the multiplications are replaced by the additions by using a Radix-4 Booth Multiplier, totally 1737 additions are needed to complete one time of sampling rate conversion.

As can be seen, numerous sampling rate converting mechanisms applied to the audio digital-to-analog converting system have been disclosed in the prior art, but their operations are too huge and cannot be omitted. In addition, their considerations on cost and the whole efficiency are not good enough. Hence, the audio digital-to-analog converting system presently needs to be improved to provide the function of converting sampling rates without increasing any dedicated PLL circuit.

SUMMARY OF THE INVENTION

It is one of the objectives of the claimed invention to provide a digital-to-analog converting system with sampling rate conversions and a related method to solve the abovementioned problems.

According to an exemplary embodiment of the present invention, a digital-to-analog converting system with sampling rate conversions is provided. The digital-to-analog converting system includes an interpolator, S orders of operating and filtering units, an up-converting and down-converting circuit, and a signal processing circuit. The interpolator performs an N-times interpolation on a first digital input signal to generate a second digital input signal, wherein a second frequency of the second digital input signal is N times of a first frequency of the first digital input signal. Each order of the operating and filtering unit includes a K-times zero-padding circuit and a filtering circuit. The K-times zero-padding circuit performs a K-times zero-padding operation on the second digital input signal to generate a third digital input signal, wherein a third frequency of the third digital input signal is K times of the second frequency. The filtering circuit is coupled to the K-times zero-padding circuit for performing a filtering operation on the third digital input signal to generate a filtered digital input signal. The up-converting and down-converting circuit performs a B-times up-conversion and an A-times down-conversion on the filtered digital input signal to generate a fourth digital input signal. The signal processing circuit generates an analog output signal according to the fourth digital input signal. The first digital input signal is an audio signal, and the digital-to-analog converting system is an audio analog-to-analog converting system.

According to an exemplary embodiment of the present invention, a sampling rate converting method applied to a digital-to-analog converting system is provided. The sampling rate converting method includes the steps of performing an N-times interpolation on a first digital input signal to generate a second digital input signal having a second frequency being N times of a first frequency of the first digital input signal; performing a K-times zero-padding operation on the second digital input signal to generate a third digital input signal having a third frequency being K times of the second frequency; performing a filtering operation on the third digital input signal to generate a filtered digital input signal; repeating the above-mentioned steps of K-times zero-padding operation and filtering operation for S times; performing a B-times up-conversion and an A-times down-conversion on the filtered digital input signal to generate a fourth digital input signal; and generating an analog output signal according to the fourth digital input signal.

As can be seen, the present invention provides a digital-to-analog converting system with sampling rate conversions and a related sampling rate converting method. By adding the S orders of operating and filtering circuits (including the K-times zero-padding circuit and the low-pass filtering circuit) into the digital-to-analog converting system, the operations of the conventional audio digital-to-analog converting system can be substantially reduced. Because all the center frequencies of the image signals of the filtered digital input signal located in the frequency spectrum fall beyond two times of the audio frequency range, the original high-order filter located between the up-converting portion and the down-converting portion can be omitted, which has an obvious effect in lowering calculations and in controlling cost. In addition, the optimum values of A, B, and S can be determined according to the algorithm disclosed in the present invention. Therefore, the audio digital-to-analog converting system disclosed in the present invention can not only provide the function of converting sampling rates but also achieve a goal of reducing operations while it maintains its playback quality without increasing any dedicated PLL circuit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a table illustrating corresponding values between audio sampling rates and operating clocks of an audio digital-to-analog converting system.

DETAILED DESCRIPTION

Figure 5:
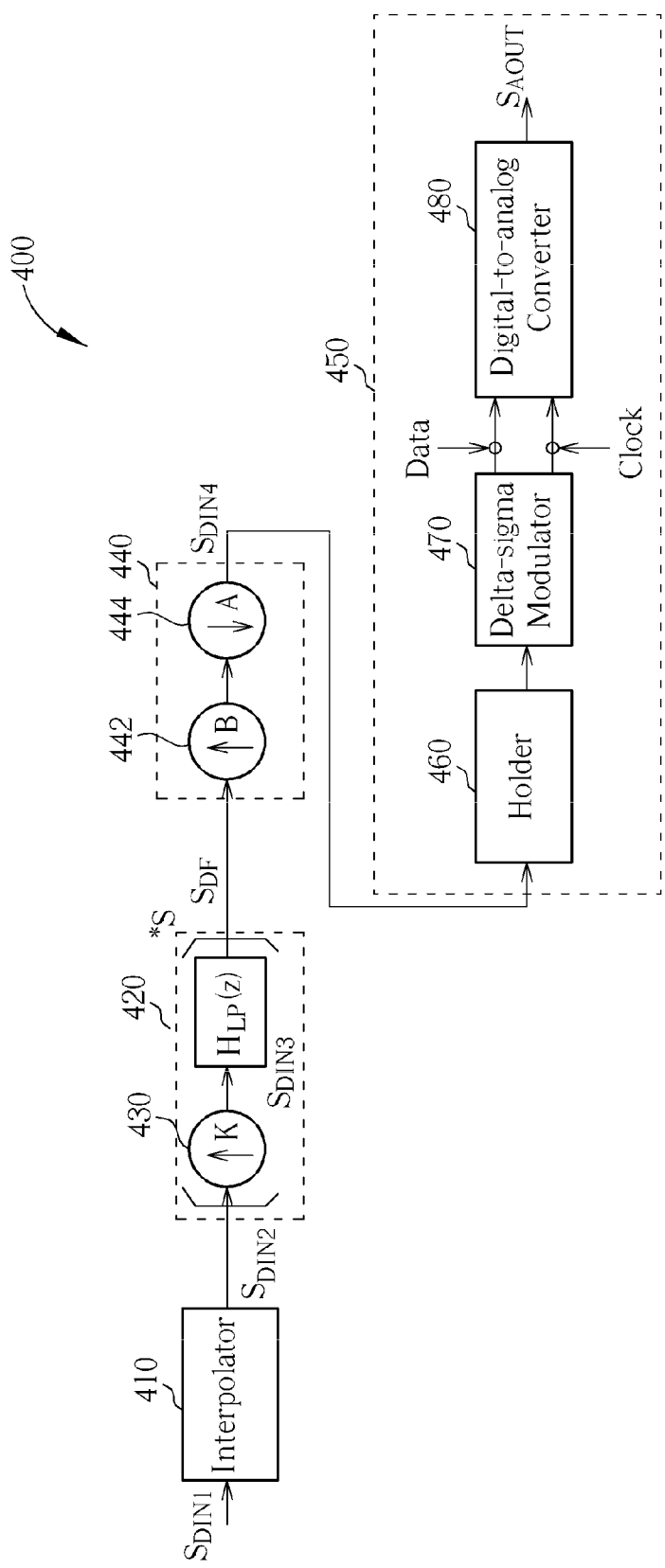
FIG. 5 is a diagram showing a digital-to-analog converting system with sampling rate conversions according to an embodiment of the present invention.

Please refer to FIG. 5. FIG. 5 is a diagram showing a digital-to-analog converting system 400 with sampling rate conversions according to an embodiment of the present invention. The digital-to-analog converting system 400 includes, but is not limited to, an interpolator 410, S orders of operating and filtering units 420, an up-converting and down-converting circuit 440, and a signal processing circuit 450. The interpolator 410 performs an N-times interpolation on a first digital input signal $S_{DIN1}$ to generate a second digital input signal $S_{DIN2}$, wherein a second frequency $f_2$ of the second digital input signal $S_{DIN2}$ is N times of a first frequency $f_1$ of the first digital input signal $S_{DIN1}$. For example, the interpolator 410 is an 1:8 interpolator (i.e. N=8), and thus the second frequency $f_2$ is eight times of the first frequency $f_1$, but this should not be a limitation of the present invention. Each order of the operating and filtering unit 420 includes a K-times zero-padding circuit 430 and a low-pass filtering circuit $H_{LP}(z)$. The K-times zero-padding circuit 430 performs a K-times zero-padding operation on the second digital input signal $S_{DIN2}$ to generate a third digital input signal $S_{DIN3}$, wherein a third frequency $f_3$ of the third digital input signal $S_{DIN3}$ is K times of the second frequency $f_2$ (i.e. $f_3=K\times f_2$). The low-pass filtering circuit $H_{LP}(z)$ is coupled to the K-times zero-padding circuit 430 for performing a filtering operation on the third digital input signal $S_{DIN3}$ to generate a filtered digital input signal $S_{DF}$. The up-converting and down-converting circuit 440 includes an up-converting portion 442 and a down-converting portion 444 respectively performs a B-times up-conversion and an A-times down-conversion on the filtered digital input signal $S_{DF}$ to generate a fourth digital input signal $S_{DIN4}$. The signal processing circuit 450 is coupled to the up-converting and down-converting circuit 440. The signal processing circuit 450 includes a holder 460, a delta-sigma modulator 470, and a digital-to-analog converter 480. The holder 460 performs a 1/2/4-times data recycling on the fourth digital input signal $S_{DIN4}$. The delta-sigma modulator 470 performs a delta-sigma operation on the fourth digital input signal $S_{DIN4}$ after data recycling to generate an output data DATA. Finally, the digital-to-analog converter 480 performs a digital-to-analog conversion on the output data DATA to generate an analog output signal $S_{AOUT}$. Operations of the holder 460, the delta-sigma modulator 470, and the digital-to-analog converter 480 are well known by the skilled in the art, therefore the description is omitted here.

In this embodiment, the digital-to-analog converting system 400 is an audio digital-to-analog converting system, and the first digital input signal $S_{DIN1}$ is an audio signal.

Please note that the abovementioned parameters S, A, and B can be calculated according to a designated algorithm, which will be detailed in the following embodiments. For example, with deriving an data rate equaled 6 Mbps at the output of the delta-sigma modulator 470 and setting the repeating time of the holder 460 equal 1, the first frequency $f_1$ of the first digital input signal $S_{DIN1}$ equals 48 KHz, S equals 0, A equals 8, and B equals 125. When the first frequency $f_1$ of the first digital input signal $S_{DIN1}$ equals 44.1 KHz, S equals 4, A equals 127, and B equals 135. When the first frequency $f_1$ of the first digital input signal $S_{DIN1}$ equals 32 KHz, S equals 4, A equals 71, and B equals 104. In other words, when the first frequency $f_1$ of the first digital input signal $S_{DIN1}$ equals 48 KHz, no extra operating and filtering unit 420 is needed. When the first frequency $f_1$ of the first digital input signal $S_{DIN1}$ equals 44.1 KHz or 32 KHz, four orders of operating and filtering units 420 are needed. However, the embodiments above are merely examples for illustrating the present invention, and should no be limitations of the present invention.

Be noted that the abovementioned low-pass filter $H_{LP}(Z)$ can be implemented by a FIR filter, such as a third-order FIR filter having a frequency response of [0.25, 0.75, 0.75, 0.25] with K=2. It should be appreciated by those skilled in the art that this should not be a limitation of the present invention, and the present invention can adopt other filters to implement it, such as cascaded comb filters. Furthermore, the decay of the frequency response of the abovementioned low-pass filter $H_{LP}(Z)$ within the audio frequency range (i.e. 20 Hz~20 KHz) is merely 0.036 dB, which confirms to the standard. Through using the low-pass filter $H_{LP}(Z)$ to perform the sampling rate conversions, operations of the conventional audio digital-to-analog system can be substantially lowered. Because all the center frequencies of the image signals of the filtered digital input signal $S_{DF}$ located in the frequency spectrum fall beyond two times of the audio frequency range (i.e. greater than 40 KHz), no extra filters located between the up-converting portion 442 and the down-converting portion 444 are needed.

Please note that again, take a sampling rate conversion of converting 44.1 KHz into 48 KHz as an example, the digital-to-analog converting system 400 totally needs 96 multiplications and 240 additions. If the multiplications are replaced by the additions by using a Radix-4 Booth Multiplier, totally 1104 additions are needed to complete one time of sampling rate conversion. Be compared with the digital-to-analog converting system 350 shown in FIG. 4, 36.44% of operations can be reduced to thereby effectively reduce the power consumption of the operations.

Figure 6:
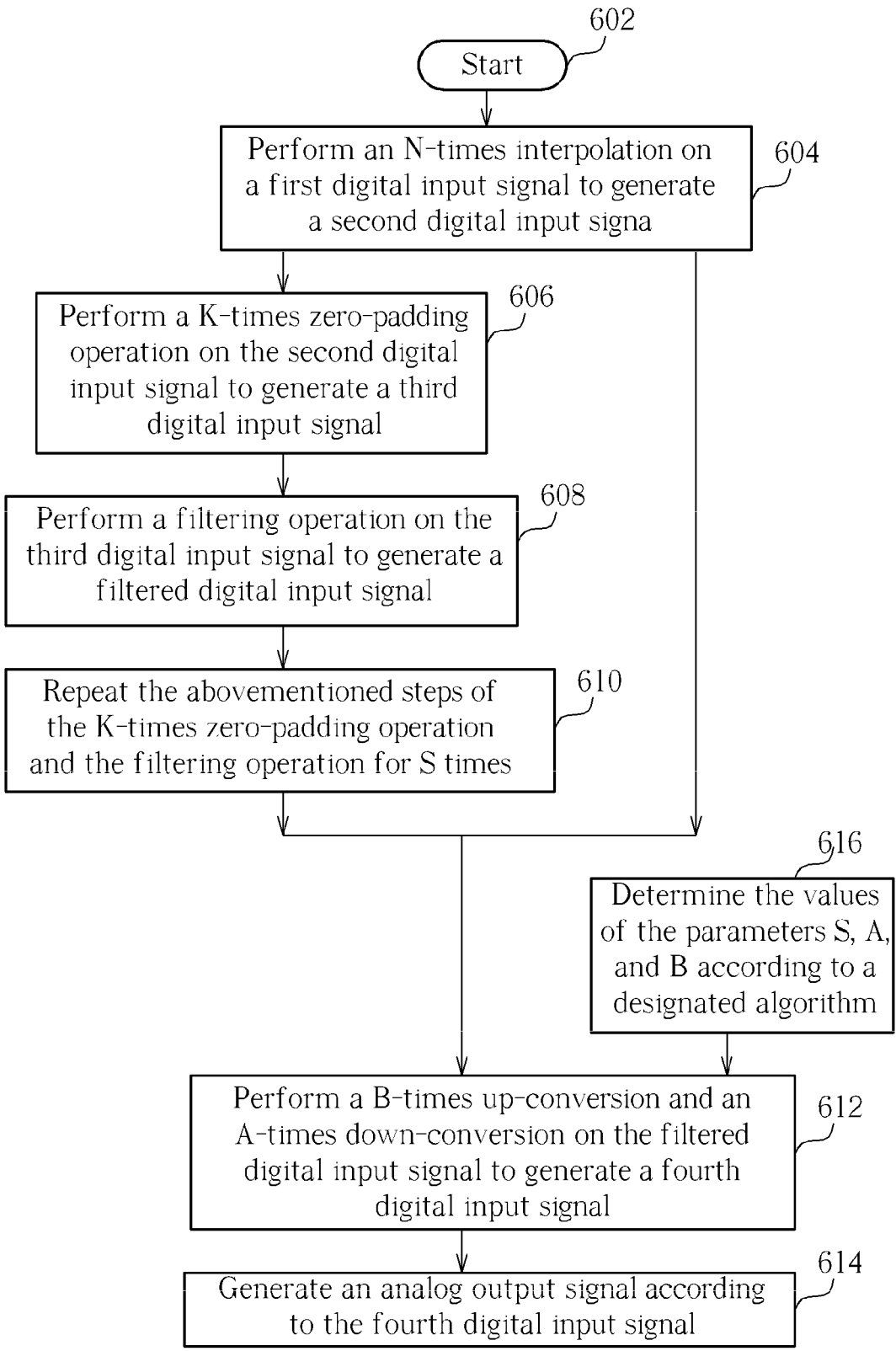
FIG. 6 is a flowchart illustrating a sampling rate converting method applied to a digital-to-analog converting system according to an exemplary embodiment of the present invention.

Please refer to FIG. 6. FIG. 6 is a flowchart illustrating a sampling rate converting method applied to an audio digital-to-analog converting system according to an exemplary embodiment of the present invention. Please note that the following steps are not limited to be performed according to the exact sequence shown in FIG. 6 if a roughly identical result can be obtained. The method includes, but is not limited to, the following steps:

Step 602: Start.

Step 604: Perform an N-times interpolation on a first digital input signal to generate a second digital input signal.

Step 606: Perform a K-times zero-padding operation on the second digital input signal to generate a third digital input signal.

Step 608: Perform a filtering operation on the third digital input signal to generate a filtered digital input signal.

Step 610: Repeat the abovementioned steps of the K-times zero padding operation and the filtering operation for S times.

Step 612: Perform a B-times up-conversion and an A-times down-conversion on the filtered digital input signal to generate a fourth digital input signal.

Step 614: Generate an analog output signal according to the fourth digital input signal.

Step 616: Determine the values of the parameters S, A, and B according to a designated algorithm.

How each element operates can be known by collocating the steps shown in FIG. 6 and the elements shown in FIG. 5, and further detailed description is omitted herein for brevity. In the following, some examples are taken for illustrating how to calculate the values of S, A, and B by the designated algorithm.

Figure 7:
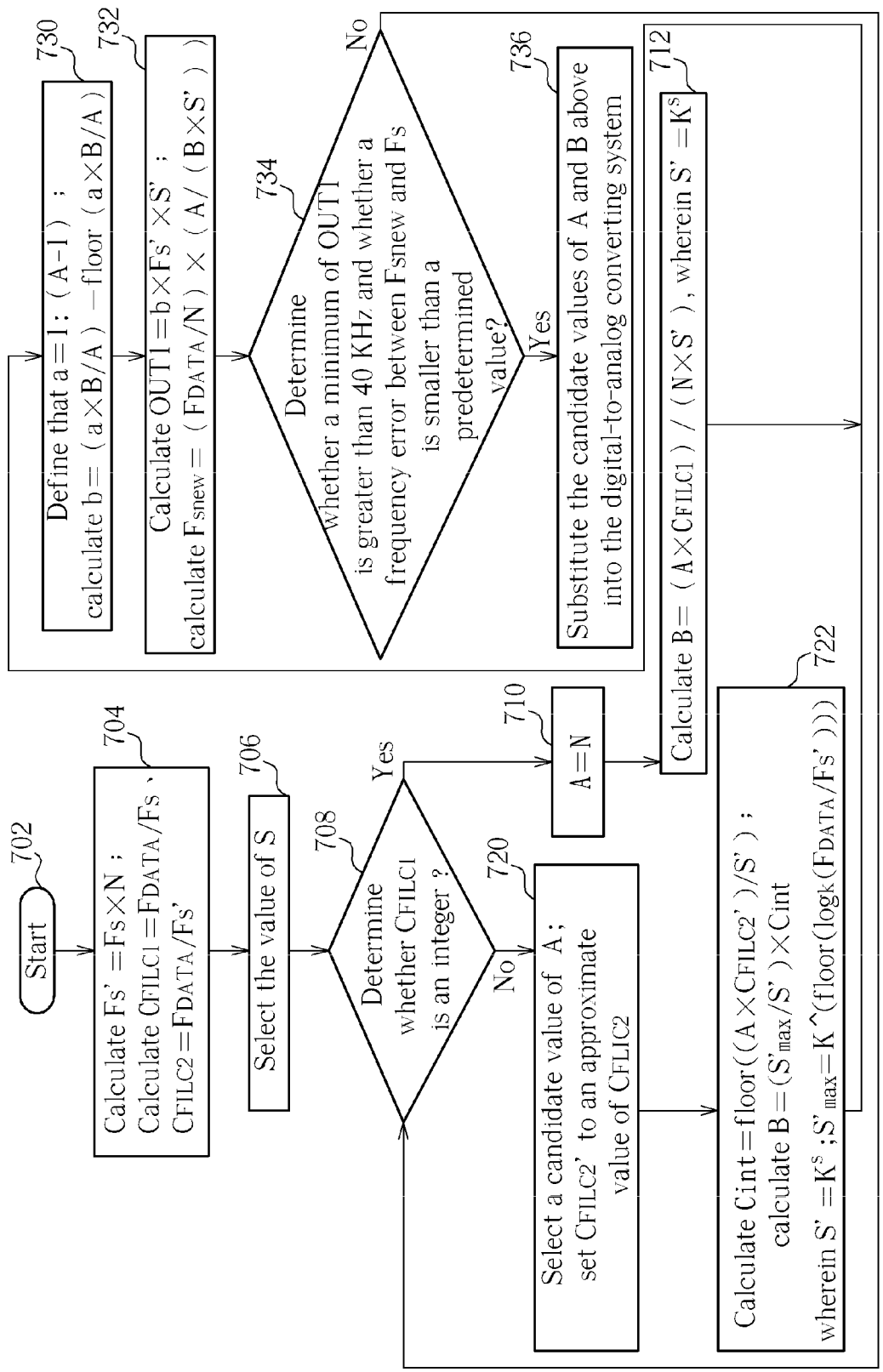
FIG. 7 is a flowchart illustrating an algorithm for determining the parameters S, A, and B shown in FIG. 5 according to an exemplary embodiment of the present invention.

Please refer to FIG. 7. FIG. 7 is a flowchart illustrating an algorithm for determining the parameters S, A, and B shown in FIG. 5 according to an exemplary embodiment of the present invention. The algorithm includes, but is not limited to, the following steps:

Step 702: Start.

Step 704: Calculate a value of Fs' according to a first equation Fs'=Fs×N, calculate a value of $C_{FILC1}$ according to a second equation $C_{FILC1}=F_{DATA}/Fs$, and calculate a value of $C_{FILC2}$ according to a third equation $C_{FILC2}=F_{DATA}/Fs'$, wherein Fs represents the first frequency $f_1$ of the first digital input signal $S_{DIN1}$, $F_{DATA}$ represents a frequency of an output data DATA generated after a data recycling operation and a sigma-delta operation are performed on the fourth digital input signal $S_{DIN4}$, and $C_{FILC2}$ represents a value of (B/A) that tens to.

Step 706: Select the value of S.

Step 708: Determine whether $C_{FILC1}$ is an integer to generate a judging result. When $C_{FILC1}$ is an integer, go to Step 710; otherwise, go to Step 720.

Step 710: Determine that the first frequency $f_1$ is equal to 48 KHz, and set the value of A to be N.

Step 712: Calculate the value of B according to a fourth equation $B=(A \times C_{FILC1})/(N \times S')$, wherein $S'=K^S$, and K is the value of the zero-padding operation under the K-times zero-padding circuit 430.

Step 720: Determine that the first frequency $f_1$ is not equal to 48 KHz, and select a candidate value of A and set $C_{FILC2}'$ to an approximate value of $C_{FLIC2}$.

Step 722: Calculate a value of $C_{int}$ according to a fourth equation $C_{int}=floor((A \times C_{FILC2}')/S')$, and calculate a candidate value of B according to a fifth equation $B=(S'_{max}/S') \times C_{int}$, wherein the term "$floor((A \times C_{FILC2}')/S')$" means a closest integer being smaller than or equal to $(A \times C_{FILC2}')/S'$, $S'=K^S$, $S'_{max}$ is an allowable maximum of S', and $S'_{max}=K^{\wedge}(floor(log_K(F_{DATA}/Fs')))$.

Step 730: Define that a=1:(A−1), and calculate a plurality of values of b according to a sixth equation b=(a×B/A)−floor(a×B/A), wherein the term "floor(a×B/A)" means a closest integer being smaller than or equal to (a×B/A).

Step 732: Calculate a plurality values of OUT1 according to a seventh equation OUT1=b×Fs'×S', wherein OUT1 represents all center frequencies of image signals located in a frequency spectrum; and calculate $FS_{new}$ according to a eighth equation $FS_{new}=(F_{DATA}/N) \times (A/(B \times S'))$, wherein $FS_{new}$ represents an estimated value of Fs.

Step 734: Determine whether a minimum among the plurality values of OUT1 is greater than 40 KHz and determine whether a frequency error between $FS_{new}$ and Fs is smaller than a predetermined value. When the minimum is greater than 40 KHz and the frequency error is smaller than the predetermined value, go to Step 736; otherwise, go back to Step 708.

Step 736: Substitute the candidate values of A and B above into the digital-to-analog converting system.

Please note that the abovementioned steps are merely a practicable embodiment of the present invention, and in no way should be considered to be limitations of the scope of the present invention. The method can include other intermediate steps or several steps can be merged into a single step for suitable modifications without departing from the spirit of the present invention.

At first, the values of Fs', $C_{FILC1}$, and $C_{FILC2}$ are calculated according to the equations listed in Step 704. Then, the value of S is selected. For example, the value of S can be selected by a try and error manner, but how to select the value of S is not limited in the present invention. In Step 708, determine whether $C_{FILC1}$ is an integer. When the first frequency $f_1$ of the first digital input signal $S_{DIN1}$ equals 48 KHz and set $F_{DATA}$ equal 6 MHz, $C_{FILC1}$ is an integer ($C_{FILC1}=F_{DATA}/48K=125$). Thus, the value of A is set to be N (N=8), and calculate the value of B according to the equation listed in Step 712 (the steps 710-712). When the first frequency $f_1$ of the first digital input signal $S_{DIN1}$ is not 48 KHz, $C_{FILC1}$ is not an integer. Thus, select a candidate value of A and calculate a candidate value of B according to the equation listed in Step 722 (the steps 720-722). Utilize a and b to calculate the locations of center frequencies of image signals located in the frequency spectrum, and calculate the estimated value $Fs_{new}$ (the steps 730-732) of Fs. When the minimum of OUT1 is greater than 40 KHz and the frequency error is smaller than the predetermined value, Substitute the values of S, A and B above into the digital-to-analog converting system 400 (Step 736); otherwise, repeat the steps 708-734 until the suitable values of S, A, and B are found.

In the following, several examples are taken for detail illustration. In a first condition, when the frequency $F_{DATA}$ of the output data DATA of the delta-sigma modulator 470 is equal to 6 MHz, the zero-padding K is 2, and the sampling rate Fs is equal to 48 KHz, select S to be 0. At this time, $C_{FILC1}$ is an integer. Set A to be 8, and calculate B according to the equation B=(8×125)/(8×2⁰)=125. And then define a=1:7 and calculate that b=[0.625 0.25 0.875 0.5 0.125 0.75 0.375]. The minimum of OUT1 is 48 KHz, which is greater than 40 KHz. Under this condition, no extra low-pass filter $H_{LP}(z)$ is needed.

In a second condition, when the frequency $F_{DATA}$ of the output data DATA of the delta-sigma modulator 470 is equal to 6 MHz, the zero-padding K is 2, and the sampling rate Fs is equal to 44.1 KHz, select S to be 4. At this time, $C_{FILC1}$ is not an integer. Select A=127, $C_{FILC2}'=17.007$ (an approximate value of 17.006802), $S'=2^4=16$, and calculate $C_{int}$ according to the equation $C_{int}=\text{floor}(127×17.007/16)=134$ and calculate B according to the equation B=(16/2⁴)×134=134. And then define a=1:126 and calculate that b=[0.055 0.1102 . . . 0.9449]. The minimum of OUT1 is 44.447 KHz, which is greater than 40 KHz. But $Fs_{new}=44.426$ KHz and the frequency error=+0.8%, which is greater than 0.01% (the designated value) and is not ideal. Hence, repeat the steps 708-734 until the values A=127, B=135, and S=4 are determined. Under this condition, four orders of K-times zero-padding circuit 430 (K=2) and low-pass filtering circuit $H_{LP}(z)$ are needed, which has a frequency error of −0.0063%.

In a third condition, when the sampling rate Fs is equal to 32 KHz, the values of A=71, B=104, S=4 can be determined according to the steps shown in FIG. 7. Under this condition, four orders of K-times zero-padding circuit 430 (K=2) and low-pass filtering circuit $H_{LP}(z)$ are needed, which has a frequency error of 0.00375%.

In other conditions, if the sampling rate is a common lower sampling rate (such as 8 KHz, 11.025 KHz, 12 KHz, 16 KHz, 22.05 KHz, or 24 KHz), a data recycling mechanism (such as the holder 460) after the sampling rate conversion can be adopted to complete it. Or the optimum values of A, B, and S can be determined according to the steps shown in FIG. 7. Also, if the sampling rate is a common higher sampling rate for the high audio quality system (such as 64 KHz, 88.2 KHz or 96 KHz), we can increase the $F_{DATA}$ as two times or reduce the N as a half in the operating and filtering unit 420 to keep the optimum values of A, B and S we demonstrate in the present invention.

Figure 2:
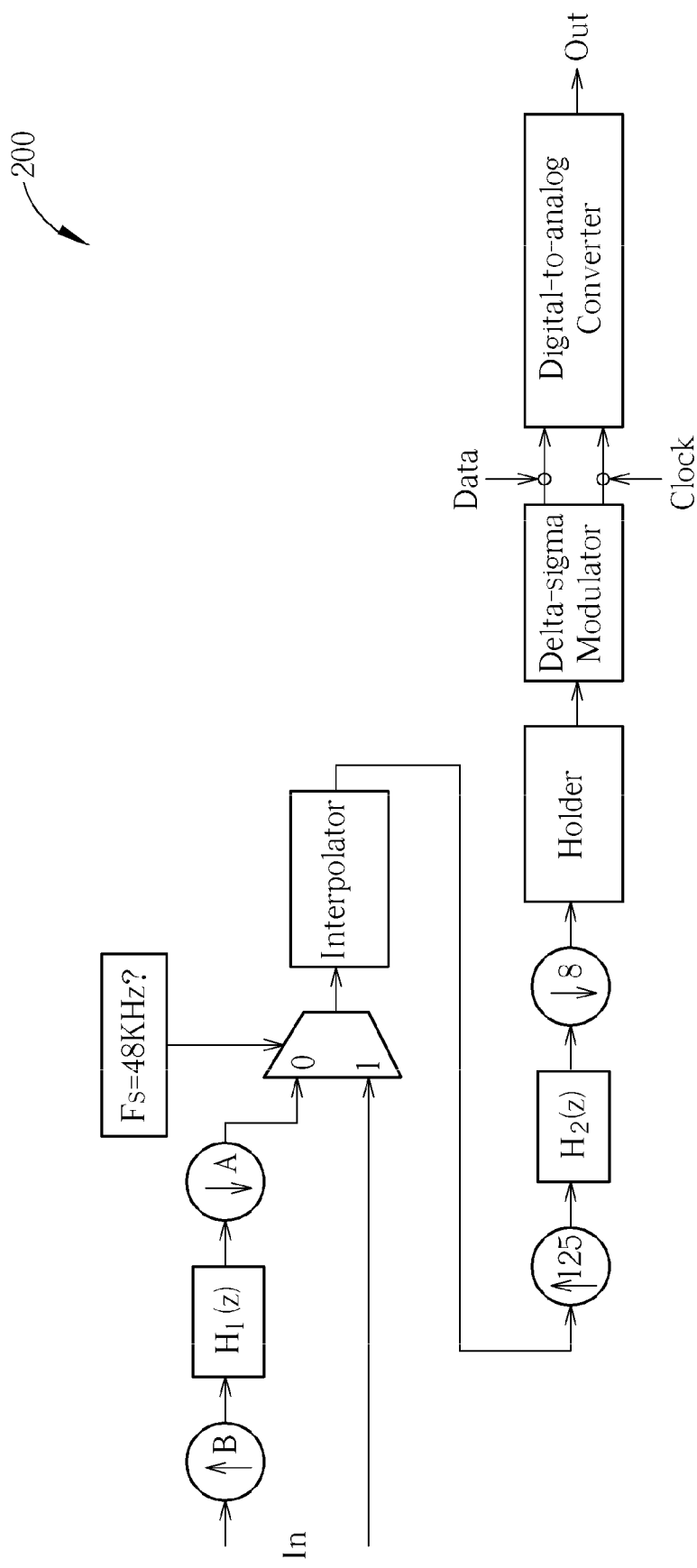
FIG. 2 is a diagram showing a conventional digital-to-analog converting system with sampling rate conversions according to the prior art.
Figure 3:
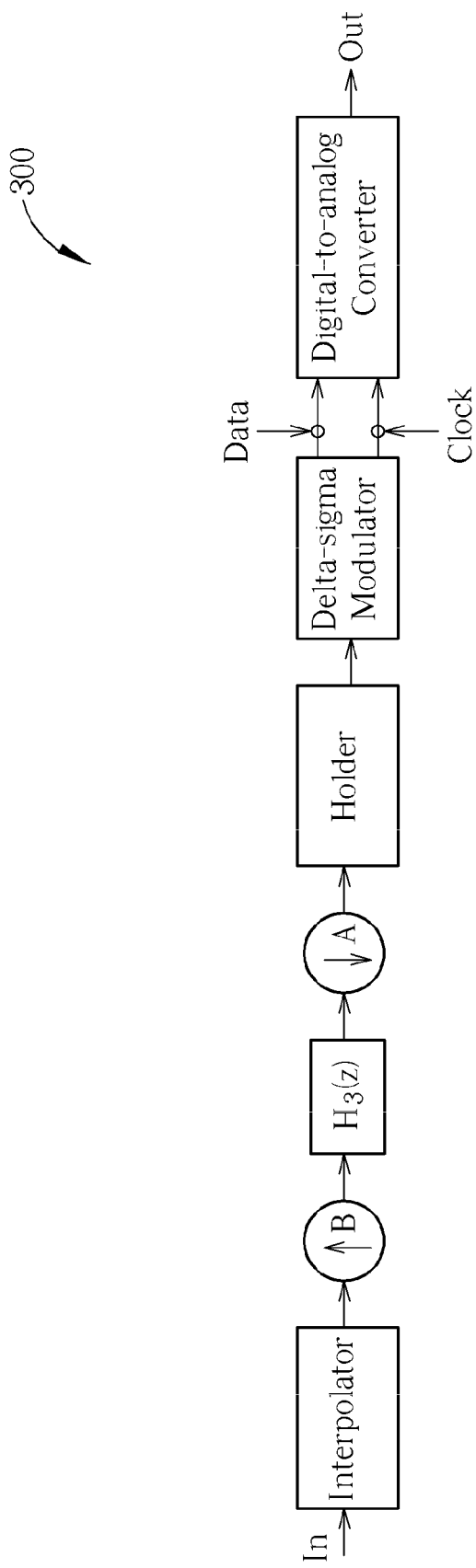
FIG. 3 is a diagram showing a conventional digital-to-analog converting system with sampling rate conversions according to the prior art.
Figure 4:
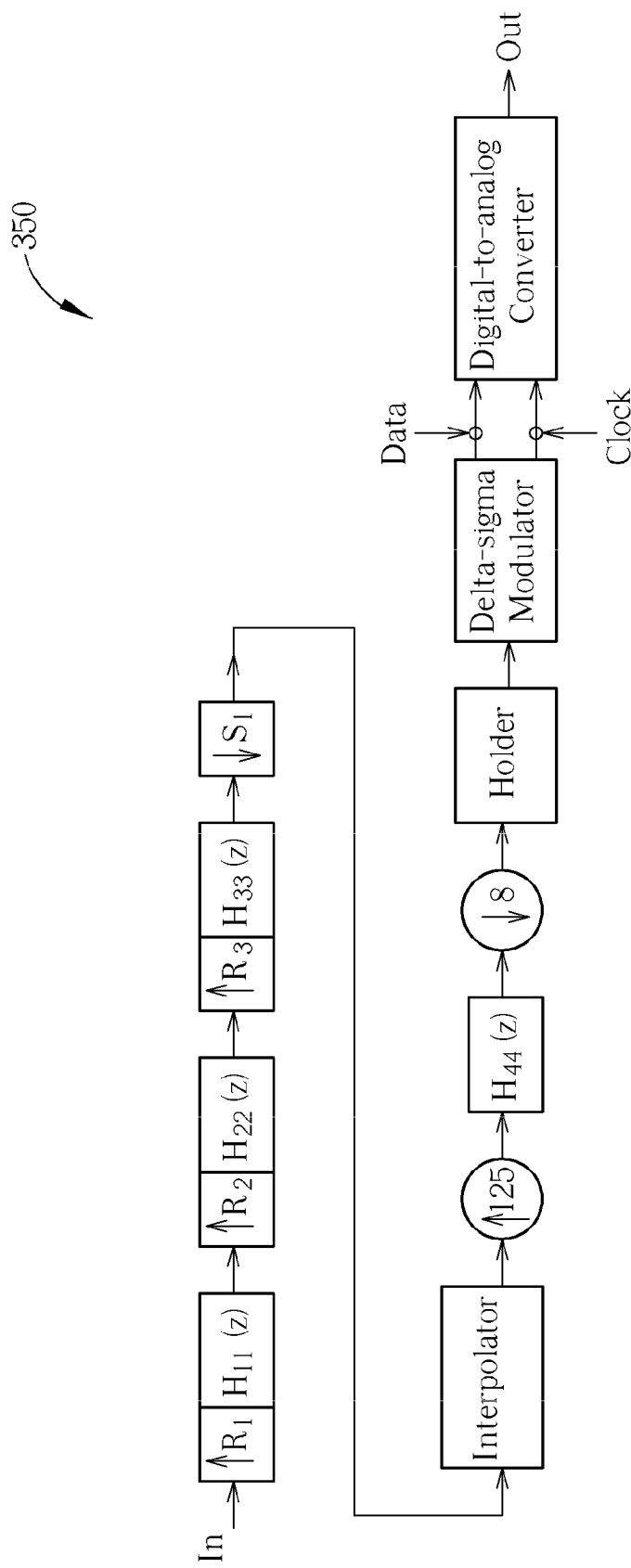
FIG. 4 is a diagram showing a conventional digital-to-analog converting system with sampling rate conversions according to the prior art.
Figure 8:
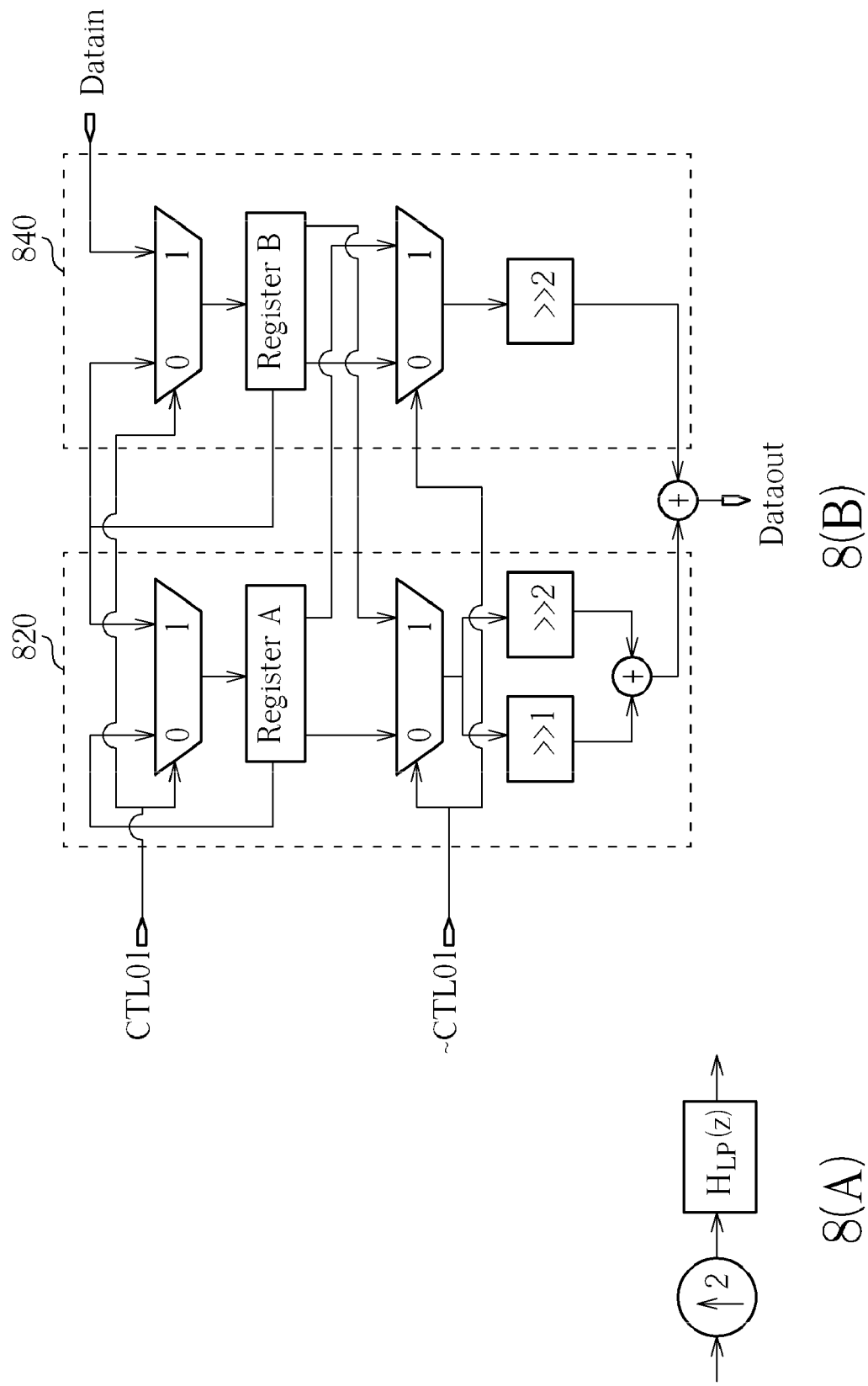
FIG. 8 (including 8A and 8B) is a diagram showing a reference circuit of the K-times zero-padding circuit (K=2) and the low-pass filtering circuit shown in FIG. 5.
Figure 9:
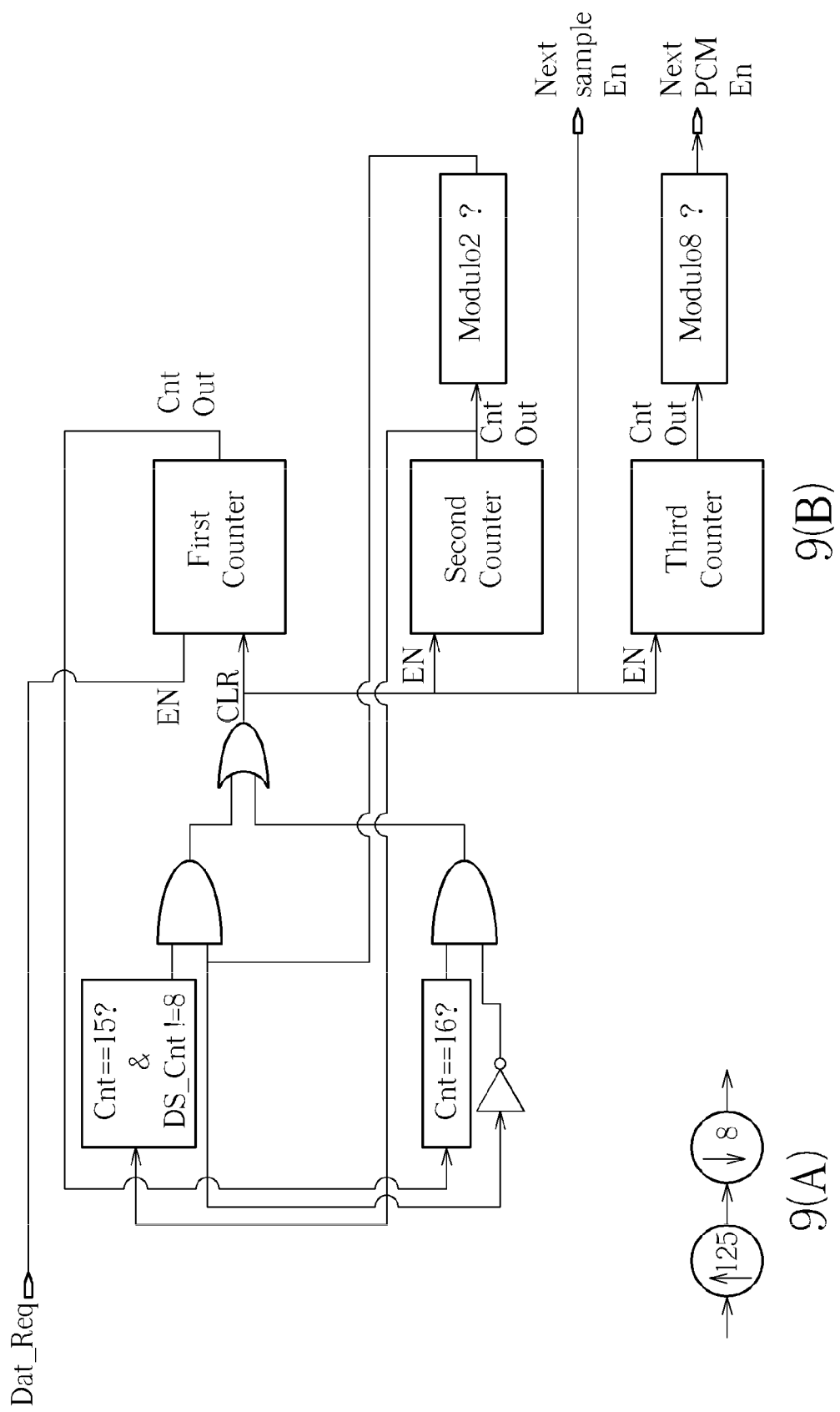
FIG. 9 (including 9A and 9B) is a diagram showing a reference circuit of the up-converting and down-converting circuit shown in FIG. 5.

As can be seen by comparing the digital-to-analog converting system 400 disclosed in the present invention with the digital-to-analog converting systems 200, 300, and 350 shown in FIG. 2, FIG. 3, and FIG. 4, two circuits—the S orders of operating and filtering units 420 (including the K-times zero-padding circuit 430 and the low-pass filtering circuit $H_{LP}(z)$) and the up-converting and down-converting circuit 400 are added into the present invention. Please refer to FIG. 8 and FIG. 9. FIG. 8 (including 8A and 8B) is a diagram showing a reference circuit of the K-times zero-padding circuit 430 (K=2) and the low-pass filtering circuit $H_{LP}(z)$ shown in FIG. 5, and FIG. 9 (including 9A and 9B) is a diagram showing a reference circuit of the up-converting and down-converting circuit 440 shown in FIG. 5. In FIG. 8, a third-order FIR filter with the frequency response of [0.25, 0.75, 0.75, 0.25] is taken as an example for implementing the low-pass filtering circuit $H_{LP}(z)$, wherein a first portion 820 is used for implementing one path of 0.75 and a second portion 840 is used for implementing another path of 0.25. In FIG. 9, take B=125 and A=8 (the sampling rate is equal to 48 KHz) as an example. Due to 125/8=15.625, a count value Cnt is set to 15 or 16. The reference circuit shown in FIG. 9 can be amended to be applied to different sampling rates (such as 44.1 KHz or 32 KHz). The embodiments above are merely examples for illustrating the present invention, and should no be limitations of the present invention. Those skilled in the art should appreciate that other circuit architectures can be adopted to implement the operating and filtering unit 420 and the up-converting and down-converting circuit 440, which should also belong to the scope of the present invention.

The abovementioned embodiments are presented merely for describing the present invention, and in no way should be considered to be limitations of the scope of the present invention. In summary, the present invention provides a digital-to-analog converting system with sampling rate conversions and a related sampling rate converting method. By adding the S orders of operating and filtering circuits 420 (including the K-times zero-padding circuit 430 and the low-pass filtering circuit $H_{LP}(z)$) into the digital-to-analog converting system 400, the operations of the conventional audio digital-to-analog converting system can be substantially reduced. Because all the center frequencies of the image signals of the filtered digital input signal $S_{DF}$ located in the frequency spectrum all fall beyond two times of the audio frequency range (i.e. greater than 40 KHz), the original high-order filter located between the up-converting portion 442 and the down-converting portion 444 can be omitted, which has an obvious effect in lowering calculations and in lowering cost and thereby reduces the power consumption of operations. In addition, the optimum values of A, B, and S can be determined according to the algorithm disclosed in FIG. 7. Therefore, the audio digital-to-analog converting system 400 disclosed in the present invention can not only provide the function of converting sampling rates but also achieve a goal of reducing operations while it maintains the playback quality without increasing any dedicated PLL circuit. Furthermore, the out-of-band rejection of the digital-to-analog converting system 400 is −60 dB, which can satisfy the standard of the audio digital-to-analog converting system recently.

Those skilled in the art will readily observe that numerous modifications and alterations of the device and method may be made while retaining the teachings of the invention.

What is claimed is:

1. A digital-to-analog converting system with sampling rate conversions, comprising:
    an interpolator, for performing an N-times interpolation on a first digital input signal to generate a second digital input signal, wherein a second frequency of the second digital input signal is N times of a first frequency of the first digital input signal;
    S orders of operating and filtering units, each order of the operating and filtering units comprising:

a K-times zero-padding circuit, for performing a K-times zero-padding operation on the second digital input signal to generate a third digital input signal, wherein a third frequency of the third digital input signal is K times of the second frequency; and a filtering circuit, coupled to the K-times zero-padding circuit, for performing a filtering operation on the third digital input signal to generate a filtered digital input signal;

an up-converting and down-converting circuit, for performing a B-times up-conversion and an A-times down-conversion on the filtered digital input signal to generate a fourth digital input signal; and a signal processing circuit, coupled to the up-converting and down-converting circuit, for generating an analog output signal according to the fourth digital input signal.

2. The digital-to-analog converting system of claim 1, wherein the first digital input signal is an audio signal, and the digital-to-analog converting system is an audio digital-to-analog converting system.

3. The digital-to-analog converting system of claim 2, wherein N equals 8, K equals 2, S equals 0, A equals 8, and B equals 125 when the first frequency of the first digital input signal equals 48 KHz.

4. The digital-to-analog converting system of claim 2, wherein N equals 8, K equals 2, S equals 4, A equals 127, and B equals 135 when the first frequency of the first digital input signal equals 44.1 KHz.

5. The digital-to-analog converting system of claim 2, wherein N equals 8, K equals 2, S equals 4, A equals 71, and B equals 104 when the first frequency of the first digital input signal equals 32 KHz.

6. A sampling rate converting method applied to a digital-to-analog converting system, comprising:

performing an N-times interpolation on a first digital input signal to generate a second digital input signal, wherein a second frequency of the second digital input signal is N times of a first frequency of the first digital input signal;

performing a K-times zero-padding operation on the second digital input signal to generate a third digital input signal, wherein a third frequency of the third digital input signal is K times of the second frequency;

performing a filtering operation on the third digital input signal to generate a filtered digital input signal;

repeating the abovementioned steps of the K-times zero-padding operation and the filtering operation for S times;

performing a B-times up-conversion and an A-times down-conversion on the filtered digital input signal to generate a fourth digital input signal; and generating an analog output signal according to the fourth digital input signal.

7. The sampling rate converting method of claim 6, wherein the first digital input signal is an audio signal, and the digital-to-analog converting system is an audio digital-to-analog converting system.

8. The sampling rate converting method of claim 7, further comprising calculating the values of S, A, and B according to a designated algorithm, and the designated algorithm comprising the steps:

(a) calculating a value of Fs' according to a first equation Fs'=Fs×N, calculating a value of $C_{FILC1}$ according to a second equation $C_{FILC1}=F_{DATA}/Fs$, and calculating a value of $C_{FILC2}$ according to a third equation $C_{FILC2}=F_{DATA}/Fs'$, wherein Fs represents the first frequency of the first digital input signal, $C_{FILC2}$ represents a value of (B/A) that tens to, $F_{DATA}$ represents a frequency of an output data generated after a data recycling operation and a sigma-delta operation are performed on the fourth digital input signal;

(b) selecting the value of S;

(c) determining whether $C_{FILC1}$ is an integer to generate a judging result; and (d) determining the values of A and B according to the judging result and the value of S.

9. The sampling rate converting method of claim 8, wherein the step (d) further comprises:

(d-1) when $C_{FILC1}$ is an integer, judging that the first frequency equals 48 KHz and setting the value of A to be N;

(d-2) calculating the value of B according to a fourth equation B=(A×$C_{FILC1}$)/(N×S'), wherein S'=$K^S$;

(d-3) defining that a=1:(A−1), and calculating a plurality of values of b according to a fifth equation b=(a×B/A)−floor(a×B/A), wherein the term "floor(a×B/A)" means a closest integer being smaller than or equal to (a×B/A);

(d-4) calculating a plurality values of OUT1 according to a sixth equation OUT1=b×Fs'×S', wherein OUT1 represents all center frequencies of image signals located in a frequency spectrum;

(d-5) calculating $FS_{new}$ according to a seventh equation $FS_{new}=(F_{DATA}/N)\times(A/(B\times S'))$, wherein $FS_{new}$ represents an estimated value of Fs, $F_{DATA}$ represents the frequency of an output data generated after a data recycling operation and a sigma-delta operation are performed on the fourth digital input signal;

(d-6) determining whether a minimum among the plurality values of OUT1 is greater than 40K and determining whether a frequency error between $FS_{new}$ and Fs is smaller than a predetermined value; and (d-7) when the minimum is greater than 40K and the frequency error is smaller than the predetermined value, determining the values of A and B according to the steps of (d-1) and (d-2).

10. The sampling rate converting method of claim 8, wherein the step (d) further comprises:

(d-1) when $C_{FILC1}$ is not an integer, judging that the first frequency is not equal to 48 KHz, and selecting a candidate value of A and setting $C_{FILC2}'$ to an approximate value of $C_{FLIC2}$;

(d-2) calculating a value of $C_{int}$ according to a fourth equation $C_{int}=floor((A\times C_{FILC2}')/S')$, and calculating a candidate value of B according to a fifth equation B=($S'_{max}$/S'), wherein the term "floor((A×$C_{FILC2}'$)/S')" means a closest integer being smaller than or equal to (A×$C_{FILC2}'$)/S', S'=$K^S$, $S'_{max}$ is an allowable maximum of S', and $S'_{max}=K^{\wedge}(floor(\log_K(F_{DATA}/Fs')))$;

(d-3) defining that a=1:(A−1), and calculating a plurality of values of b according to a sixth equation b=(a×B/A)−floor(a×B/A), wherein the term "floor(a×B/A)" means a closest integer being smaller than or equal to (a×B/A);

(d-4) calculating a plurality values of OUT1 according to a seventh equation OUT1=b×Fs'×S', wherein OUT1 represents all center frequencies of image signals located in a frequency spectrum;

(d-5) calculating $FS_{new}$ according to a eighth equation $FS_{new}=(F_{DATA}/N)\times(A/(B\times S'))$, wherein $FS_{new}$ represents an estimated value of Fs, $F_{DATA}$ represents the frequency of an output data generated after a data recycling operation and a sigma-delta operation are performed on the fourth digital input signal;

(d-6) determining whether a minimum among the plurality values of OUT1 is greater than 40K and determining whether a frequency error between $FS_{new}$ and Fs is smaller than a predetermined value; and (d-7) when the minimum is not greater than 40K or the frequency error is not smaller than the predetermined value, repeating the steps of (c), and (d-1) to (d-7).

11. The sampling rate converting method of claim 10, wherein the step (d) further comprises:
(d-8) when the minimum is not greater than 40K or the frequency error is not smaller than the predetermined value, determining the values of A and B according to the candidate values of A and B obtained in the steps of (d-1) and (d-2).

12. The sampling rate converting method of claim 7, wherein N equals 8, K equals 2, S equals 0, A equals 8, and B equals 125 when the first frequency of the first digital input signal equals 48 KHz.

13. The sampling rate converting method of claim 7, wherein N equals 8, K equals 2, S equals 4, A equals 127, and B equals 135 when the first frequency of the first digital input signal equals 44.1 KHz.

14. The sampling rate converting method of claim 7, wherein N equals 8, K equals 2, S equals 4, A equals 71, and B equals 104 when the first frequency of the first digital input signal equals 32 KHz.

* * * * *